United States Patent

Barna et al.

[11] Patent Number: 5,864,773
[45] Date of Patent: Jan. 26, 1999

[54] VIRTUAL SENSOR BASED MONITORING AND FAULT DETECTION/CLASSIFICATION SYSTEM AND METHOD FOR SEMICONDUCTOR PROCESSING EQUIPMENT

[75] Inventors: Gabriel G. Barna, Richardson; Stephanie W. Butler, Plano, both of Tex.; Donald A. Sofge, Leesburg, Va.; David A. White, Cambridge, Mass.

[73] Assignee: Texas Instruments Incorporated, Dallas, Tex.

[21] Appl. No.: 743,113

[22] Filed: Nov. 1, 1996

Related U.S. Application Data

[60] Provisional application No. 60/007,237 Nov. 3, 1995.

[51] Int. Cl.$^6$ ....................................................... G01B 7/00
[52] U.S. Cl. ........................... 702/85; 702/182; 702/183; 702/189
[58] Field of Search ........................ 364/571.01, 571.02, 364/572, 574, 578, 579, 550, 551.01, 552, 725.02, 274.4, 276.6, 972.4, 130, 138, 148, 149, 150, 468.01, 468.15, 468.16, 468.17; 395/1, 20, 21, 50; 156/345; 216/67; 382/156; 438/689

[56] References Cited

U.S. PATENT DOCUMENTS

| | | | |
|---|---|---|---|
| 5,274,572 | 12/1993 | O'Neill et al. | 364/550 |
| 5,305,221 | 4/1994 | Atherton | 364/468 |
| 5,319,580 | 6/1994 | Sakata et al. | 364/579 |
| 5,386,373 | 1/1995 | Keeler et al. | 364/577 |
| 5,406,502 | 4/1995 | Haramaty et al. | 364/551.01 |
| 5,453,156 | 9/1995 | Cher et al. | 156/643.1 |
| 5,459,668 | 10/1995 | Dogan et al. | 364/456 |
| 5,465,321 | 11/1995 | Smyth | 395/22 |
| 5,479,340 | 12/1995 | Fox et al. | 364/153 |
| 5,486,995 | 1/1996 | Krist et al. | 364/149 |
| 5,526,293 | 6/1996 | Mozumder et al. | 364/578 |
| 5,528,510 | 6/1996 | Kraft | 364/468 |
| 5,548,528 | 8/1996 | Keeler et al. | 364/497 |
| 5,566,092 | 10/1996 | Wang et al. | 364/551.02 |
| 5,570,300 | 10/1996 | Henry et al. | 364/551.01 |
| 5,642,296 | 6/1997 | Saxena | 364/552 |
| 5,646,870 | 7/1997 | Krivokapic et al. | 364/578 |
| 5,655,110 | 8/1997 | Krivokapic et al. | 395/500 |
| 5,658,423 | 8/1997 | Angell et al. | 438/9 |
| 5,659,467 | 8/1997 | Vickers | 364/138 |
| 5,680,409 | 10/1997 | Qin et al. | 371/48 |

*Primary Examiner*—John Barlow
*Assistant Examiner*—Patrick Assouad
*Attorney, Agent, or Firm*—Mark A. Valetti; Carl H. Hoel; Richard L. Donaldson

[57] ABSTRACT

A virtual sensor based monitoring and fault detection/classification system (10) for semiconductor processing equipment (12) is provided. A plurality of equipment sensors (14) are each operable to measure a process condition and provide a signal representing the measured process condition. A plurality of filtering process units (16) are each operable to receive at least one signal from the plurality of equipment sensors (14) and to reduce data represented by the at least one signal and provide filtered data. A plurality of virtual sensors (24) are each operable to receive the filtered data. The plurality of virtual sensors (24) model states of the processing equipment (12) and a work piece in the processing equipment (12). Each virtual sensor is operable to provide an output signal representing an estimated value for the modeled state. A rule based logic system (26) is operable to receive and process the signals provided by the plurality of equipment sensors (14) and the output signals provided by the virtual sensors (24) to monitor processing equipment (12) or to detect and classify faults within the processing equipment (12).

18 Claims, 1 Drawing Sheet

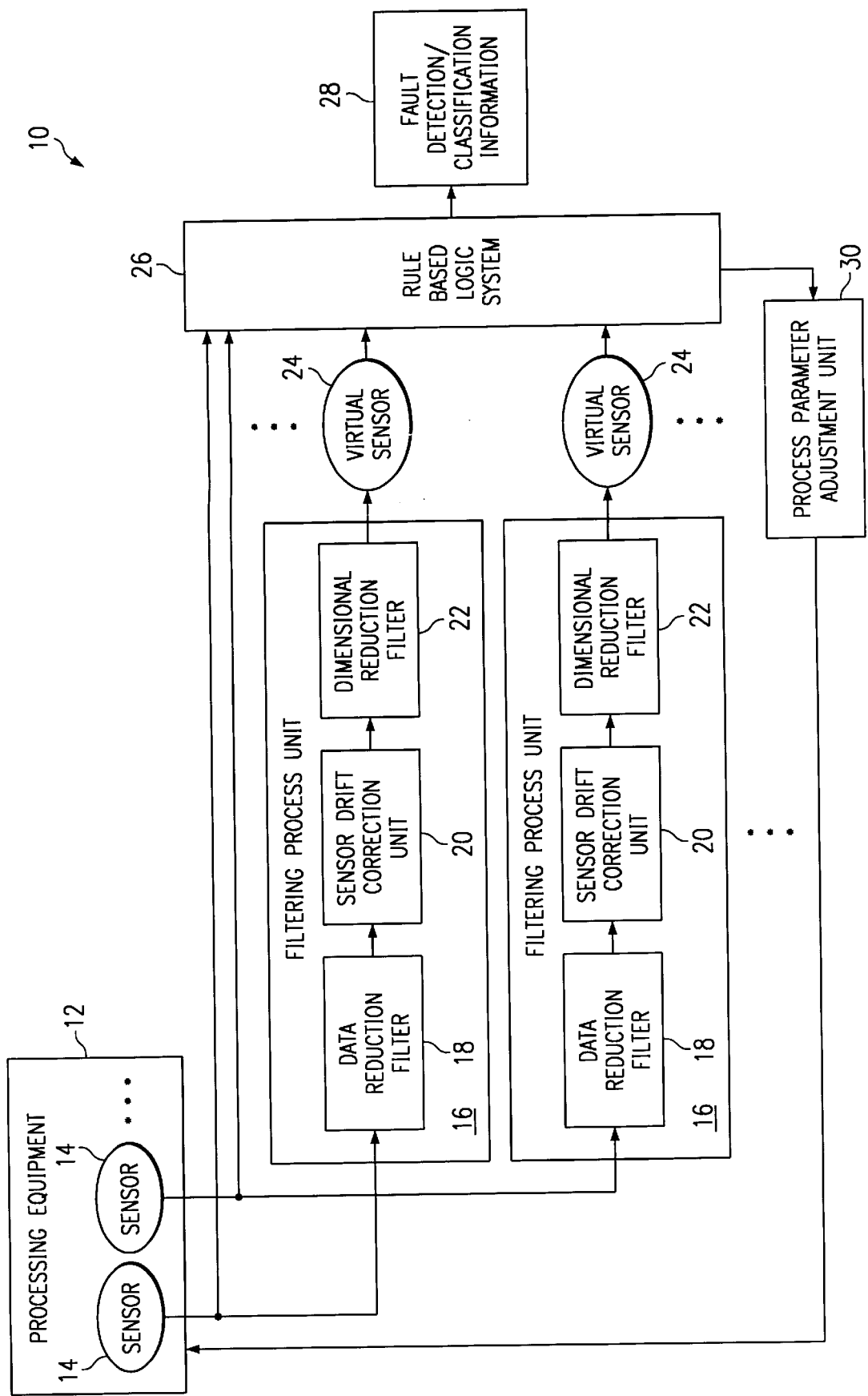

VIRTUAL SENSOR BASED MONITORING AND FAULT DETECTION/CLASSIFICATION SYSTEM AND METHOD FOR SEMICONDUCTOR PROCESSING EQUIPMENT

This application claims priority under 35 USC § 119(e)(1) of provisional application No. 60/007,237 filed Nov. 3, 1995.

TECHNICAL FIELD OF THE INVENTION

This invention relates in general to semiconductor processing and manufacturing environments, and more particularly to a virtual sensor based monitoring and fault detection/classification system and method for semiconductor processing equipment.

BACKGROUND OF THE INVENTION

Future industry needs may include application specific integrated circuits whose manufacture will require flexible fabrication and processing equipment. The flexibility of this equipment will enable meeting the specifications of differing integrated circuit designs. Substantial improvements in sensor and process control development will be important to the realization of such flexible semiconductor manufacturing systems. The characterization of functional relationships involved in the deposition, photo-resist, patterning, and etching processes used to fabricate integrated circuit devices is an essential part of developing flexible and cost-effective manufacturing processes for advanced integrated circuit devices. For example, the plasma chemistry of etching systems involves complex nonlinear behavior with numerous chemical reactions interacting with electrical and physical affects. Accurate characterization and monitoring of this behavior is important. However, as a result of the complexity, characterization and monitoring of the process operating space can be extremely difficult.

Equipment sensors such as RFM, OES, and other added sensors, as well as built-in sensors, are a double edged sword. Sensors provide information used to characterize functional relationships, but the quantity of information can be prohibitive. Processing multiple real time sensor information is complex, and beyond the capability of conventional systems.

Conventional process control strategies often are developed only through expensive and time consuming trial and error methods and are unlikely to provide either the flexibility or cost efficiency necessary to implement a competitive production process for future integrated circuit devices. In these conventional systems, relationships between process and control parameters are developed through trial and error to generate process recipes. These recipes can be inflexible and not adaptive to conditions within the processing equipment as the conditions change with repeated use. For example, in a plasma etch reactor, a conventional recipe may not compensate for thin film buildup on reactor walls.

Conventional approaches to processing equipment fault detection and classification have relied solely on directly measurable sensor feedback. Obvious faults such as an equipment sensor failure are detectable, and periodic recalibrations are necessary to bring drifting sensors back to defined norms. However, conventional monitoring and fault detection systems and methods do not address adequately the problem of sensor failure detection, sensor bias, and sensor drift meet current and future industry needs.

Specifically with respect to plasma etch systems, conventional processing equipment monitors the process state (plasma condition) in the form of end-point detection using mono-chromatic spectral line detectors to determine when the etch process has completed. A number of conventional systems also use multi-chromatic spectral analysis of plasma in order to determine some of the physical phenomena of plasma etching including detection and measurement of interacting chemical species within the plasma during various stages of etch.

SUMMARY OF THE INVENTION

Therefore, a need has arisen for a system and method for monitoring and for fault detection and classification that can accurately estimate machine, process and work piece states in order to provide processing flexibility for semiconductor processing equipment.

In accordance with the present invention, a virtual sensor based monitoring and fault detection and classification system and method for semiconductor processing equipment is provided that substantially eliminate or reduce disadvantages and problems associated with previously developed processing systems and methods.

According to one embodiment of the present invention, a virtual sensor based monitoring and fault detection/classification system for semiconductor processing equipment is provided. A plurality of equipment sensors are each operable to measure a process condition and provide a signal representing the measured process condition. A plurality of filtering process units are each operable to receive at least one signal from the plurality of equipment sensors and to reduce data represented by the at least one signal and provide filtered data. A plurality of virtual sensors are each operable to receive the filtered data. The plurality of virtual sensors model states of the processing equipment and a work piece in the processing equipment. Each virtual sensor is operable to provide an output signal representing an estimated value for the modeled state. A rule based logic system is operable to receive and process the signals provided by the plurality of equipment sensors and the output signals provided by the virtual sensors to monitor processing equipment or to detect and classify faults within the processing equipment.

BRIEF DESCRIPTION OF THE DRAWINGS

A more complete understanding of the present invention and advantages thereof may be acquired by referring to the following description taken in conjunction with the accompanying drawing in which like reference numbers indicate like features and wherein:

The FIGURE is a block diagram of one embodiment of a virtual sensor based monitoring and fault detection and classification system for semiconductor processing equipment constructed according to the teachings of the present invention.

DETAILED DESCRIPTION OF THE INVENTION

Block Diagram of System

The FIGURE is a block diagram of a virtual sensor based monitoring and fault detection and classification system, indicated generally at 10, for semiconductor processing equipment 12. In one embodiment of the present invention, processing equipment 12 comprises a LAM 9600 metal etcher.

A plurality of equipment sensors 14 are coupled to processing equipment 12. Equipment sensors 14 comprise sensors built into processing equipment 12 as well as sensors mounted to processing equipment 12 for measuring machine and process states of processing equipment 12. In the LAM 9600 embodiment, sensors 14 include sensors for measuring RF power, DC bias, and gas feedflow rates, as well as sensors for measuring plasma conditions such as a spatially-resolved optical emission spectrometer (OES). Each sensor 14 provides signals representing the measured conditions as output. Each of these output signals can comprise a large number of metrics which characterize the output signal. The present invention provides integration of complex information represented by the large number metrics where the total number of metrics in such a complex system is greater than ten.

A plurality of filtering process units 16 are coupled to the plurality of equipment sensors 14 and receive the output signals from equipment sensors 14. Each filtering processing unit 16 receives output signals from at least one sensor 14. In the illustrated embodiment, there is a one-to-one match between equipment sensors 14 and filtering process units 16. However, other implementations are possible where one or more filtering process units 16 receive multiple output signals from equipment sensors 14 and where receipt of output signals can be redundant between filtering process units 16.

In the embodiment of the FIGURE, each filtering process unit 16 comprises a data reduction filter 18 which is coupled to an associated equipment sensor 14. Each data reduction filter 18 receives the output signal from the associated equipment sensor 14. Each data reduction filter 18 provides reduced data as an output. Each filtering process unit 16 also comprises a sensor drift correction unit 20 coupled to data reduction filter 18 and receiving the reduced data from data reduction filter 18. Each sensor drift correction unit 20 provides corrected data as an output. Each filtering process unit 16 further comprises a dimensional reduction filter 22 coupled to sensor drift correction unit 20 and receiving the corrected data. Each dimensional reduction filter 22, in turn, provides filtered data as an output.

A plurality of virtual sensors 24 are coupled to the plurality of filtering process units 16 and receive the filtered data from filtering process units 16. In the illustrated embodiment, there is a one-to-one match between virtual sensors 24 and filtering process units 16. However, in other implementations, virtual sensors 24 can receive one or more filtered data outputs from filtering process units 16 including redundant receipt of filtered data outputs. Virtual sensors 24 model and estimate machine, process and/or work piece states with respect to processing equipment 12. In the LAM 9600 embodiment of the present invention, virtual sensors 24 model and estimate machine and process-states of the LAM 9600 and the wafer-state of the semiconductor wafer being etched.

System 10 further comprises a rule-based logic system 26. Logic system 26 is coupled to the plurality of equipment sensors 14 and to the plurality of virtual sensors 24. Logic system 26 processes the machine, process and work piece-state estimations provided by virtual sensors 24 as well as the direct measurements provided by equipment sensors 14. Logic system 26 then provides fault detection/classification information 28 based upon the processed signals. Fault detection/classification information 28 provides a user with notification of an occurrence of a fault within processing equipment 12 as well as an estimated sources of the faults.

Logic system 26 also provides information to process parameter adjustment unit 30. Process parameter adjustment unit 30 uses the information received from logic system 26 to adjust process parameters of processing equipment 12 to maintain the machine, process and work piece states within desired limits.

Operation of System

In operation, system 10 processes the complex information provided by equipment sensors 14 using filtering process units 16 and virtual sensors 24 in order to produce estimates, generally redundant, of machinery process and wafer states with respect to processing equipment 12. Rule based logic system 26 then uses information provided by equipment sensors 14 and estimates provided by virtual sensors 24 to provide fault detection and classification information 28 as well as to provide information to allow adjustment of process parameters.

Data reduction filters 18 can operate according to a number of data reduction algorithms. The purpose of data reduction filters 18 generally is to remove noise and other undesirable characteristics from the signals received from equipment sensors 14. Dimensional reduction filters 22 operate to reduce the dimension of the analysis problem according to any of a number of dimensional reduction algorithms including principal component analysis (PCA).

Sensor drift correction units 20 operate between the two filters 18 and 22, and correct data according to sensor drift models of equipment sensors 14. Sensor drift correction units 20 keep track of the occurrence of events which affect equipment sensor 14 readings, such as window cleaning or chamber cleaning, and automatically correct long-term drift tendencies of equipment sensors 14. Through the operation of sensor drift correction units 20, the models used by virtual sensors 24 remain accurate despite shifts in sensor measurements of equipment sensors 14.

Virtual sensors 24 operate according to various modeling techniques to estimate machine, process and work piece states based upon the filtered data provided by filtering process units 16. Virtual sensors 24 can be based upon a number of modeling techniques, including, but not limited to, neural network modeling, partial lease squares modeling, principal component regression, multiple linear regression, non-linear PLS, non-linear PCR and neural network based PLS.

Each virtual sensor 24 operates to process the filtered data and estimate a machine, process or work piece, state with respect to processing equipment 12. For example, a virtual sensor 24 could estimate line width reduction in the etching process of a LAM 9600. According to the teachings of the present invention, system 10 includes a large number of virtual sensors 24, many of which are redundant and provide estimations of the same states. With respect to wafer state estimation, virtual sensors 24 provide estimation of states for which there are no on-line sensors(e.g. line width reduction). Thus the characteristics of a wafer being processed can be inferred despite no direct contact to the wafer using information from equipment sensors 14 such as RF sensors and OES sensors.

Rule based logic system 26 provides fault detection classification information 28 comprising accurate determination of faults within processing equipment 12 as well as classification of those faults. In addition, rule based logic system 26 provides information to process parameter adjustment unit 30 such that process parameters for processing equipment 12 can be optimized in terms of desired machine, process and work piece state characteristics using the estimations by virtual sensors 24. The process parameters of processing equipment 12 can be adjusted such that virtual sensors 24 produce estimates matching the desired machine process or work piece states.

In the illustrated embodiment, rule based logic system 26 can generate information on two basic categories of faults: machine or process state faults and work piece state faults. With respect to machine or process state faults, the inputs to rule based logic system 26 include the machine set points, measurements from equipment sensors 14 and outputs from virtual sensors 24. With respect to work piece state faults, rule based logic system 26 uses as inputs target values for the work piece state and outputs of virtual sensors 24. It should be understood that, with respect to the outputs of virtual sensors 24, the redundancy present in those outputs provides better information with respect to the work piece state actually existing in processing equipment 12. It is possible with redundant virtual sensor output to eliminate a virtual sensor that may be providing inaccurate estimations either due to faulty inputs or a faulty model.

According to the teachings of the present invention, the combination of a dimensional reduction filter, using a process such as principal component analysis (PCA), with a model, using a process such as a neural network, to create an estimator of machine, process and work piece states can be referred to as non-linear dimensional reduction, or, with respect to PCA, non-linear PCA. Virtual sensors benefitting from this non-linear dimensional reduction can provide estimates of system variables from complex sensor measurements otherwise not processable for real-time use.

For example, the dimensionality of optical emission data measured across a wide range of wavelengths throughout the etch of a wafer may produce a measurement vector on the order of $10^3$. This is computationally intractable for real-time estimation using conventional digital processor technology. According to the present invention, PCA can be used to reduce the dimensionality of the data by compressing the data from measured variables to principle components. This reduced set of variables can be examined for correlations to machine, process and wafer states. Once these correlations are determined, such as by empirical analysis, modeling methods can be used to map the reduced variables to real-time machine, process and wafer state estimations, some of which can not otherwise be measured until after a particular wafer has been processed. The model approximation is used to map principal components to process and wafer variables which then allows estimation of such variables.

LAM 9600 Embodiment

In one embodiment in the present invention, as mentioned above, processing equipment 12 comprises a LAM 9600 metal etcher. In this embodiment, the LAM 9600 includes a number of built-in machine state sensors such as for measuring RF power, DC bias and gas feed flow rates. There are also sensors 14 mounted to the LAM 9600 for measuring plasma conditions such as a spatially resolved optical emission spectrometer (OES). As discussed, signals from these equipment sensors 14 are reduced through the filtering process units 16 according to filtering algorithms appropriate to each sensor type (e.g., a peak selection routine can be used for the OES sensor). This data also can be reduced by the dimensional reduction filters 22 using principal components analysis (PCA).

In this embodiment, the filtered data provided by each filtering process unit 16 is used by virtual sensors 24 which comprise neural network models. Virtual sensors 24 estimate machine, process and wafer states within the LAM 9600. The neural network models within virtual sensors 24 are segmented to provide redundant indirect measurements of the estimated states.

In this embodiment, estimation is performed by mapping the principal components to wafer state measurements through function approximation of principal components to product variables. The selection of candidate methods for fitting the measurement data to the product variables can be based upon simplicity and functionality. The chosen methods should be structured so that new estimators can be quickly developed or updated given new experimental data. An additional obstacle is that there is no explicit physical interpretation of the reduced variable set obtained through PCA. The mapping from principal component projections to process conditions is accomplished through function approximation of the experimental data. The linear estimator model is developed using linear regression with a least squares fit and the nonlinear estimator uses a multi-layer perception neural network.

Rule based logic system 26 uses the various virtual sensor 24 outputs and measurements from equipment sensors 14 to draw inferences on the presence and types of faults in the LAM 9600. Neural network models also be used to track sensor drift such as that due to window clouding. This sensor drift information can be used as the basis for sensor drift correction units 20 to accurately correct data according to known drift characteristics. The estimates provided by virtual sensors 24 also can be used to control process parameters for the LAM 9600 to achieve desired post-etch wafer characteristics.

Adaptation to Other Implementations

One manner of adapting the illustrated embodiment of the present invention to other applications would include first identifying goals of the system in terms of faults to be detected and classified or controls to be optimized for improved manufacturing product quality and/or product yield. Sensors then could be identified which could be used to monitor the process. Experiments then could be performed and data gathered during on-line operation of the process to build empirical models of machine, process and sensor relationships. Neural networks then could be trained to provide a basis for virtual sensor models that would capture relationships among the machine, process and sensor states. Rules could be devised for interpretation of virtual sensor estimates in order to determine and classify faults. It also would be possible to devise a controller for optimizing manufacturing process parameters in accordance with identified goals using the virtual sensor state estimates of final product quality and yield as real time process feedback.

Rule Based Logic System

In one embodiment of the present invention, rule based logic system 26 accomplishes the production of fault detection/classification information 28 through the implementation of a set of logical comparisons of the state estimation values generated by virtual sensors 24. In this embodiment, fault detection and classification is divided into both direct and indirect faults. Direct faults are those that require relatively simple models between senor information and work piece state estimation. Indirect faults can include machine state faults, sensor problems, virtual sensor model problems, base line shifts, process changes and unidentifiable problems. Table 1 below sets forth one embodiment of potential indirect fault areas as well as basis for modeling those faults.

TABLE 1

Machine State

[note: $X_e$ denotes state estimate, $X_a$ denotes actual measured machine state, $X_c$ denotes machine setpoint (setting) used by Machine, $X_s$ denotes machine setpoint (setting) from R + R controller. Manipulated variables set by Machine only, denoted U, will be included in detailed rules for diagnosis of Machine state faults, and will be broken out appropriately when detailed rulebase is specified.]

(1) ($X_e$ ! = $X_a$ AND $X_e$ = $X_c$) OR
        ($X_e$ ! = $X_a$ AND $X_e$ = $X_x$)
        (measurement is inaccurate).
    (2) ($X_c$ ! = $X_a$ (measurement is inaccurate)
  Model: NN model correlates OES and other sensor data with machine state measurements. Inverse mapping $X_c$ = f (sensors).

Sensor Problems (3) Offset (due to baseline shift).
  Model: Correlate OES and other sensor data with offset sensor data (need to detect only)
    (4) Gain (could be due to incorrect measurement, or sensor drift).
        Not distinguishable from sensor baseline shift. If extreme, retrain models.
    (5) Attenuation (due to dirty windows)
        Not distinguishable from sensor baseline shift. If extreme, retrain models.

Virtual Sensor Model (6) model (virtual sensor) no longer valid.
        Measurements are O.K., but model predictions are inaccurate.
  Model: If measurements are directly available (not from virtual sensor), then compare virtual sensor results with direct results. (May not be directly available.)

Don't Know - Unable to determine fault because (7) Not enough data, or too much variation in data, to make algorithms "stable"
        Soln. clean reactor, restate process, revert to pen-loop procedures
    (8) Can't distinguish between two or more fault causes. Indicate possible fault causes, with probability of each.

Baseline Shift (9) Multivariate analysis may indicate need for better "baseline shift" model over time.
  Model: Develop model to correct for baseline shift over time.
    (10) No fault has occurred, but variance in data indicates fault.
    (11) Process = f (machine) has changed
        Models no longer are accurate, test by comparing predictions with actual sensor measurements if available.

With respect to faults that are unidentifiable, each virtual sensor may be trained on data over a given range. Thus, the virtual sensor may only be assumed to be valid for interpolation within that range. Each incoming sensor signal can be checked by the virtual sensors to ensure that it falls within this range. For each signal that is not within the range, the virtual sensor can be deemed invalid, and any associated list of possible faults deemed inoperative.

With respect to no-fault situations, observed variance of sensor data is inherent to most processing systems. Thus, there is a predictable drift in process baseline. It is possible to model these baseline shifts, gain/attenuation problems, and process drift and compensate for them in sensor drift correction. Some variance of sensor data is expected and normal and should not affect virtual sensor accuracy or fault detection/classification. Extreme variance of sensor data can register as out of range and associated virtual sensors can be deemed inoperative. For unmeasured or unmeasurable process drifts within model training ranges, models can be rendered invalid or may be retrained or updated.

Table 2 provides examples of rule based logic tests for determining errors as used by the rule based logic system. Table 2 is quite long, it extends over 80 lines.

TABLE 2

For Machine State Faults -
    Model $V_1$: $Xe_{(OES)}$ = $f_{nn}$ (OES)
        correlates OES data with neural state estimate of $X_c$, or setpoint (setting) used by Machine
    Model $V_2$: $Xe_{(RFM)}$ = $f_{nn}$ (RFM)
        correlates RFM data with neural state estimate of $X_c$, or setpoint (setting) used by Machine Machine State Internal Consistency Checks -
[note: $X_e$ denotes state estimate, $X_a$ denotes actual measured machine state, $X_c$ denotes setpoint (setting) used by Machine, $X_s$ denotes machine setpoint (setting) from R + R controller]

If ($X_e$(OES) ! = $X_c$ AND $X_c$ (RFM) ! = $X_c$
        AND $X_e$ (OES) ! = $X_s$ AND
        $X_e$ (RFM) ! = $X_s$ AND $X_e$ (OES) ! = $X_a$
        AND $X_e$ (RFM) ! = $X_a$ AND
        $X_e$ (OES) ! = $X_e$ (RFM))
    Then
        Model $V_1$ AND Model $V_2$ are in error.
        If ($X_a$ ! = $X_c$)
            Then measurement is inaccurate.
        If ($X_c$ ! = $X_s$)
            Then setpoint has drifted.
    Else
        If ($X_e$ (OES) ! = $X_c$ AND $X_e$ (RFM) = $X_c$)
            Set $X_e$ = $X_e$ (RFM).
            Model $V_1$ is in error. (Model $V_2$ is reliable.)
        If ($X_c$ (OES) = $X_c$ AND $X_e$ (RFM) ! = $X_c$)
            Set $X_e$ = $X_e$ (OES).
            Model $V_2$ is in error. (Model $V_1$ is reliable.)
        If ($X_e$ (OES) = $X_e$ (RFM).)
            Then Models $V_1$ and $V_2$ are reliable.
            Set $X_e$ = $X_e$ (OES).
        If ($X_s$ ! = $X_c$)
            Then software problem reading machine setpoint(s)
        Else If ($X_c$ ! = $X_a$ AND $X_e$ = $X_c$)
            Then measurement is inaccurate.
        Else If ($X_e$ = $X_a$ AND $X_a$ ! = $X_s$)
            Then setpoint has drifted.
        Else If ($X_c$ ! = $X_a$ AND $X_a$ ! = $X_s$)
            Then measurement is inaccurate AND setpoint has drifted.

For Baseline Shift Faults -
    Model $V_3$: $B_{oes}$ = $f_{nn}$ (OES)
        correlates baseline shift with OES sensor data
    Model $V_4$: $B_{rfm}$ = $f_{nn}$ (RFM)
        correlates baseline shift with RFM sensor data
    Model $V_5$: $B_{all}$ = $f_{nn}$ (OES, RFM, LAM)
        correlates baseline shift with all available sensor data Want to distinguish between baseline shifts due to sensor data drift as opposed to process drift.
    If ($B_{oes}$ = $B_{rfm}$ AND $B_{oes}$ = $B_{all}$ AND $B_{all}$ > E)
        Then Process Drift has occurred (but it is predictable).
    If ($B_{oes}$ ! = $B_{rfm}$ AND $B_{oes}$ = $B_{all}$)
        Then RFM Sensor has drifted OR Model $V_4$ is in error.
    If ($B_{oes}$ = $B_{rfm}$ AND $B_{oes}$ ! = $B_{all}$)
        Then Model $V_5$ is in error OR LAM Sensors have drifted.
    If ($B_{oes}$ ! = $B_{rfm}$ AND $B_{oes}$ ! = $B_{all}$ AND $B_{rfm}$ = $B_{all}$)
        Then OES Sensor has drifted OR Model $V_3$ is in error.
    If ($B_{oes}$ ! = $B_{rfm}$ AND $B_{oes}$ ! = $B_{all}$ AND $B_{rfm}$ ! = $B_{all}$)
        Then All Sensors have drifted OR Models $V_3$, $V_4$, $V_5$ are in error.

Model no longer valid - (Process = f (machine) no longer valid)

TABLE 2-continued

This hypothesis is tested based on internal consistency checks of Models $V_1$, $V_2$, $V_3$.
Virtual sensor model is no longer valid fault -
[Note: Wafer state variables such as line width reduction (LWR) and etch rate (ER) are designated $P_a$ for actual (post-etch) measurements, $P_e$ for on-line current estimates, and $P_p$ for next-step prediction of wafer characteristics (for purposes of control).]
    Model $V_8$: $P_{a(oes)} = f_{nn}$ (OES)
        correlates OES sensor data with wafer state characteristics
    Model $V_9$: $P_{a(RFM)} = f_{nn}$ (RFM)
        correlates RFM sensor data with wafer state characteristics
    Model $V_{10}$: $P_{a(ALL)} = f_{nn}$ (OES, RFM, LAM)
        correlates all sensor data with wafer state characteristics
    If ($P_{a(RFM)} = P_{a(ALL)}$ AND $P_{a(oes)} \,!= P_{a(ALL)}$)
        Model $V_8$ is in error.
    If ($P_{a(oes)} = P_{a(ALL)}$ AND $P_{a(RFM)} \,!= P_{a(ALL)}$)
        Model $V_9$ is in error.
    If ($P_{a(oes)} = P_{a(RFM)}$ AND $P_{a(RFM)} \,!= P_{a(ALL)}$)
        Model $V_{10}$ is in error.

Principle Component Analysis

As discussed above, one algorithm used within dimensional reduction filters 22 is principal component analysis. For example, optical emission spectroscopy (OES) measurements have been shown to provide in-situ estimates of process parameters and plasma conditions. However this information is often buried among a wide range of measurements that hinder real-time processing. A real-time estimation approach can be developed which correlates multi-variable sensor data during operation to estimate work piece state characteristics.

Principal component analysis has recently emerged from the area of chemo-metrics as a useful tool for data reduction and analysis. Principal component analysis (PCA) allows for the reduction of a large set of correlated measurements to that which can be more easily interpreted while retaining significant information contained within the data.

A spatial interpretation of principal component analysis for work piece state characteristics may, for example, indicate two zero-centered measurement variables with sampled data. Projections of the standard deviation of the data onto vectors can provide information regarding the natural coordinates of the data. By rotating the original axes and onto the more natural coordinates an orthogonal space can be found where the primary axes align along the directions of maximum variance. The experimental data may indicate a linear relationship between the two measured variables. By rotating the coordinate system along the direction of maximum variance in the data, the two measured variables could be well-represented by one variable. Since PCA provides the direction of the maximum variance in the data, in this case the projection of and onto the first principal component compresses the dimensionality of the data from 2 to 1.

Once the principal components are determined, subsequent measurements can be projected onto the natural coordinates or principal components to reduce dimensionality. Once these projections are complete, the components can be plotted to determine linear correlations in the data or indicate variables which may be truncated.

Summary and Overview of Virtual Sensor Based System

The system and method of the present invention provide an approach to processing equipment diagnostics and control that uses multiple redundant virtual sensor models of machine, process, and work piece state conditions. Data compression and filtering are used to process information contained in the measurements made by equipment sensors. The redundant virtual sensors provide virtual measurements as a means for detecting machine and sensor faults as well as estimating characteristics on-line that may only be measured directly offline. This on-line feedback using multiple redundant virtual sensors also allows in-situ control of semiconductor processing with optimization for desired characteristics.

A technical advantage of the present invention is the use of neural networks to model nonlinear multi-variable relationships to create virtual sensors. These virtual sensors provide on-line estimates of machine, process and wafer state characteristics. The virtual sensors and on-line state estimation provide a means for a rule-based logic system to draw inferences regarding fault detection and classification for run-to-run feedback optimization and control of the processing equipment.

Another technical advantage of the present invention is this use of the multiple redundant virtual sensors to detect and classify faults. The fault detection and classification system can be adapted to machine and process changes through retraining of the virtual sensors' underlying models. In addition, principal component analysis and other data reduction techniques are used to reduce and compress data received from multiple equipment sensors.

The virtual sensor based system and method of the present invention are broadly applicable to numerous other manufacturing processes with perhaps greatest applicability to semiconductor manufacturing processes. Many manufacturing processes may be improved through increased use of sensors for a variety of functions including fault detection and classification, prediction of final product quality and advanced process control. Specifically, the use of indirect methods of measuring internal process states through multi-variant modeling of machine and process variables and the use of multiple redundant measures of machine and process states provides a unique means for performing fault detection and classification for manufacturing systems. In addition, the indirect sensing through virtual sensor models makes possible to optimize manufacturing process control to result in improved product quality and maximized yield.

An additional technical advantage of the present invention is the provision of semiconductor processing equipment that allows flexible manufacturing processes including mathematical models for characterizing process conditions, improvements in sensor development and information processing, process optimization strategies to determine proper equipment settings, methods to adapt mathematical models on-line, and synthesis between diagnostics and controls to update equipment settings on-line.

Another technical advantage of the present invention is the use of multiple redundant virtual sensors to model and estimate machine, process, and work piece states. These estimated states provide an advantageous approach to monitoring and fault handling for semiconductor processing equipment.

A further technical advantage of the present invention is the use of principal component analysis based data compression and the use of modeling algorithms for correlating multi-variable sensor data. In this context, data compression is used to maximize information contained in measurements made by equipment sensors to construct a reduced set of information for monitoring and for fault detection and classification.

An additional technical advantage of the present invention is the implementation of redundant virtual sensors to provide virtual measurements as a means for detecting machine and sensor faults as well as for estimating machine, process and work piece states on-line. Such states otherwise may only be directly measured off-line in the post-process stage. This on-line feedback using multiple redundant virtual sensors also can allow in-situ wafer-to-wafer control of the semiconductor processing with optimization for desired wafer state characteristics.

Another technical advantage of the present invention is the use of neural networks to model non-linear multivariable relationships to create virtual sensors. The virtual sensors can be coupled with equipment sensors (e.g., optical emission spectroscopy) to provide on-line estimates of machine, process and work piece state characteristics. These on-line state estimations provide a means for run-to-run feedback optimization, control of the processing equipment and fault detection and classification through use of a rule based logic system to draw inferences from the estimated states.

A further technical advantage of the present invention is the adaptation of monitoring and fault detection and classification to account for machine and process changes through retraining of the models upon which the virtual sensors are based. Principal component analysis and other data reduction and dimensional reduction techniques are used to reduce and compress raw data received from equipment sensors to manageable amounts of information.

Although the present invention has been described in detail, it should be understood that various changes, substitutions and alterations can be made hereto without departing from the spirit and scope of the invention as defined by the appended claims.

What is claimed is:

1. A virtual sensor based fault detection and classification system for semiconductor processing equipment, comprising:
   a plurality of equipment sensors coupled to processing equipment, each of the plurality of sensors operable to measure a process condition and provide a signal representing the measured process condition;
   a plurality of filtering process units coupled to the plurality of equipment sensors, each filtering process unit operable to receive at least one signal from the plurality of equipment sensors, and each filtering process unit operable to reduce data represented by the at least one signal and provide filtered data;
   a plurality of redundant virtual sensors coupled to the plurality of filtering process units and operable to receive the filtered data, a first portion of the plurality of redundant virtual sensors modeling states of the processing equipment and a second portion of the plurality of redundant virtual sensors modeling states of a work piece in the processing equipment, and each redundant virtual sensor operable to provide an output signal representing an estimated value for the modeled state;
   a rule based logic system coupled to the plurality of equipment sensors and to the plurality of redundant virtual sensors, the rule based logic system operable to receive and process the signals provided by the plurality of equipment sensors and the output signals provided by the redundant virtual sensors to detect and classify faults within the processing equipment;
   and wherein each redundant virtual sensor is comprised of a plurality of virtual sensors each of which provide an output signal, said output signals of said each virtual sensor is compared to the output signals of the other virtual sensors associated to a particular redundant virtual sensor and the output signal of each redundant virtual sensor is the output signal of the virtual sensors which have a similar output.

2. The virtual sensor based fault detection and classification system of claim 1, wherein at least one of the virtual sensors comprises a trained neural network model.

3. The virtual sensor based fault detection and classification system of claim 1, wherein each signal provided by the plurality of equipment sensors comprises a plurality of metrics.

4. The virtual sensor based fault detection and classification system of claim 1, further comprising an output device coupled to the rule based logic system, the output device operable to display fault detection and classification information to a user.

5. The virtual sensor based fault detection and classification system of claim 1, further comprising a process parameter adjustment unit coupled to the rule based logic system, the process parameter adjustment unit operable to adjust process parameters of the processing equipment.

6. The virtual sensor based fault detection and classification system of claim 1, wherein each filtering process unit comprises a data reduction filter operable to receive the at least one signal, to process the at least one signal according to a data reduction algorithm, and to provide reduced data.

7. The virtual sensor based fault detection and classification system of claim 1, wherein each filtering process unit comprises a sensor drift correction unit operable to receive reduced data, to correct the reduced data signal responsive to modeled sensor drift, and to provide corrected data.

8. The virtual sensor based fault detection and classification system of claim 1, wherein each filtering process unit comprises a dimensional reduction filter operable to receive corrected data, to reduce the corrected data according to a dimensional reduction algorithm, and to provide filtered data.

9. The virtual sensor based fault detection and classification system of claim 1, wherein each filtering process unit comprises a dimensional reduction filter operable to receive corrected data, to reduce the corrected data according to a principle component analysis algorithm, and to provide filtered data.

10. A virtual sensor based monitoring system for monitoring conditions in processing equipment, comprising:
    a plurality of equipment sensors coupled to processing equipment, each of the plurality of sensors operable to measure a process condition and provide a signal representing the measured process condition;
    a plurality of filtering process units coupled to the plurality of equipment sensors, each filtering process unit operable to receive at least one signal from the plurality of equipment sensors, and each filtering process unit operable to reduce data represented by the at least one signal and provide filtered data, wherein each filtering process unit comprises;
    a data reduction filter operable to receive the at least one signal, to process the at least one signal according to a data reduction algorithm, and to provide reduced data;
    a sensor drift correction unit operable to receive the reduced data, to correct the reduced data responsive to modeled sensor drift, and to provide corrected data; and
    a dimensional reduction filter operable to receive the corrected data, to reduce the corrected data according to a dimensional reduction algorithm, and to provide filtered data;

a plurality of redundant virtual sensors coupled to the plurality of filtering process units and operable to receive the filtered data, a first portion of the plurality of redundant virtual sensors modeling states of the processing equipment and a second portion of the plurality of redundant virtual sensors modeling states of a work piece in the processing equipment, and each virtual sensor operable to provide an output signal representing an estimated value for the modeled state;

and wherein each redundant virtual sensor is comprised of a plurality of virtual sensors each of which provide an output signal, said output signals of said each virtual sensor is compared to the output signals of the other virtual sensors associated to a particular redundant virtual sensor and the output signal of each redundant virtual sensor is the output signal of the virtual sensors which have a similar output.

11. The virtual sensor based monitoring system of claim 10, wherein at least one of the virtual sensors comprises a trained neural network model.

12. The virtual sensor based monitoring system of claim 10, wherein the dimensional reduction filter is operable to reduce the corrected data according to a principle component analysis algorithm.

13. The virtual sensor based monitoring system of claim 10, wherein each signal provided by the plurality of equipment sensors comprises a plurality of metrics and a total number of metrics is greater than ten.

14. The virtual sensor based monitoring system of claim 10, further comprising a process parameter adjustment unit coupled to the rule based logic system, the process parameter adjustment unit operable to adjust process parameters of the processing equipment.

15. A method for constructing a virtual sensor based fault detection and classification system for semiconductor processing equipment, comprising:

measuring a plurality of process conditions for a processing equipment using equipment sensors and providing a plurality of signals representing the measured process conditions;

filtering the plurality of signals to reduce the data represented by the signals and providing filtered data;

processing the filtered data in a plurality of virtual sensors and using the virtual sensors to model and estimate states of the processing equipment;

providing virtual sensor output signals representing estimated values for the modeled states, said output signals obtained by comparing output signals of a plurality of redundant virtual sensors and setting said output signal to the value of said output signals of said plurality of redundant virtual sensors which have similar values;

processing the signals provided by the equipment sensors and the output signals provided by the virtual sensors using a rule based logic system to detect and classify faults within the processing equipment.

16. The method of claim 15, wherein the step of filtering comprises processing the signals according to a data reduction algorithm to produced reduced data, correcting the reduced data responsive to modeled sensor drift to produce corrected data, and processing the corrected data using a dimensional reduction algorithm.

17. The method of claim 15, wherein the step of processing the filtered data in a plurality of virtual sensors comprises using virtual sensors based on a trained neural network model.

18. The method of claim 15, wherein the step of measuring comprises providing signals where each signal comprises a plurality of metrics and a total number of metrics is greater than ten.

* * * * *